(12) United States Patent
Lee et al.

(10) Patent No.: US 11,926,558 B2
(45) Date of Patent: Mar. 12, 2024

(54) CONDUCTIVE STRUCTURE, MANUFACTURING METHOD THEREFOR, AND ELECTRODE COMPRISING CONDUCTIVE STRUCTURE

(71) Applicant: LG CHEM, LTD., Seoul (KR)

(72) Inventors: Ilha Lee, Daejeon (KR); Seung Heon Lee, Daejeon (KR); Song Ho Jang, Daejeon (KR); Dong Hyun Oh, Daejeon (KR); Ji Young Hwang, Daejeon (KR); Ki-Hwan Kim, Daejeon (KR); Han Min Seo, Daejeon (KR); Chan Hyoung Park, Daejeon (KR); Sun Young Park, Daejeon (KR)

(73) Assignee: LG CHEM LTD., Seoul (KR)

( * ) Notice: Subject to any disclaimer, the term of this patent is extended or adjusted under 35 U.S.C. 154(b) by 663 days.

(21) Appl. No.: 15/559,742

(22) PCT Filed: Mar. 28, 2016

(86) PCT No.: PCT/KR2016/003109
§ 371 (c)(1),
(2) Date: Sep. 19, 2017

(87) PCT Pub. No.: WO2016/159602
PCT Pub. Date: Oct. 6, 2016

(65) Prior Publication Data
US 2018/0046017 A1 Feb. 15, 2018

(30) Foreign Application Priority Data
Mar. 27, 2015 (KR) .......................... 10-2015-0043565
Feb. 18, 2016 (KR) .......................... 10-2016-0019151

(51) Int. Cl.
*G02F 1/1335* (2006.01)
*B32B 3/26* (2006.01)
(Continued)

(52) U.S. Cl.
CPC .............. *C03C 17/36* (2013.01); *B32B 3/266* (2013.01); *B32B 9/04* (2013.01); *B32B 15/04* (2013.01); *C03C 17/3605* (2013.01); *C03C 17/3626* (2013.01); *C03C 17/3649* (2013.01); *C03C 17/3671* (2013.01); *C23C 14/0036* (2013.01); *C23C 14/0676* (2013.01);
(Continued)

(58) Field of Classification Search
CPC ............ G02F 1/33502; C03C 17/3626; C23C 14/0676
See application file for complete search history.

(56) References Cited

U.S. PATENT DOCUMENTS

2012/0107733 A1* 5/2012 Hayashi ................. B82Y 10/00 430/5
2013/0215067 A1 8/2013 Hwang et al.
2015/0205326 A1 7/2015 Lim et al.

FOREIGN PATENT DOCUMENTS

AT 13879 U1 10/2014
IN 201617009505 7/2016
(Continued)

*Primary Examiner* — Laura A Auer
(74) *Attorney, Agent, or Firm* — Bryan Cave Leighton Paisner LLP (57) ABSTRACT

The present specification relates to a conductive structure body, a method for manufacturing the same, and an electrode and an electronic device including the conductive structure body.

15 Claims, 5 Drawing Sheets

(51) Int. Cl.
    *B32B 9/04*     (2006.01)
    *B32B 15/04*     (2006.01)
    *C03C 17/36*     (2006.01)
    *C23C 14/00*     (2006.01)
    *C23C 14/06*     (2006.01)
    *C23C 14/18*     (2006.01)
    *G02F 1/1343*     (2006.01)
    *H10K 50/86*     (2023.01)
    *G02F 1/1333*     (2006.01)
    *G06F 3/041*     (2006.01)
    *G06F 3/044*     (2006.01)
    *H10K 50/805*     (2023.01)

(52) U.S. Cl.
    CPC ...... *C23C 14/185* (2013.01); *G02F 1/133502* (2013.01); *G02F 1/13439* (2013.01); *H10K 50/86* (2023.02); *B32B 2307/202* (2013.01); *B32B 2307/416* (2013.01); *B32B 2309/105* (2013.01); *G02F 1/13338* (2013.01); *G02F 1/134363* (2013.01); *G06F 3/041* (2013.01); *G06F 3/044* (2013.01); *G06F 2203/04103* (2013.01); *H10K 50/805* (2023.02)

(56) References Cited

FOREIGN PATENT DOCUMENTS

| | | | |
|---|---|---|---|
| JP | 10-197713 A | 7/1998 | |
| JP | 4100863 B2 | 6/2008 | |
| KR | 10-2006-0063759 A | 6/2006 | |
| KR | 10-2011-0044123 A | 4/2011 | |
| KR | 10-2011-0054369 A | 5/2011 | |
| KR | 10-2012-0040679 A | 4/2012 | |
| KR | 10-2014-0030075 A | 3/2014 | |
| WO | WO-2014035207 A1 * | 3/2014 | ............ B32B 15/04 |
| WO | WO-2015048828 A1 * | 4/2015 | ............ G06F 3/044 |

* cited by examiner

CONDUCTIVE STRUCTURE, MANUFACTURING METHOD THEREFOR, AND ELECTRODE COMPRISING CONDUCTIVE STRUCTURE

TECHNICAL FIELD

This application is a National Stage Entry of International Application No. PCT/KR2016/003109, filed on Mar. 28, 2016, and claims the benefit of and priority to Korean Application No. 10-2015-0043565, filed on Mar. 27, 2015, and Korean Application No. 10-2016-0019151, filed on Feb. 18, 2016 and all of which are hereby incorporated by reference in their entirety for all purposes as if fully set forth herein.

The present specification relates to a conductive structure body, a method for manufacturing the same, and an electrode including the conductive structure body.

BACKGROUND ART

In general, a liquid crystal display is a display that respectively supplies data signals according to image information to pixels arranged in a matrix form and adjusts light transmittance of the pixels to display a desired image.

Accordingly, in the liquid crystal display, a liquid crystal panel in which the pixels are arranged in the matrix form and a driver for driving the pixels are provided.

Meanwhile, the liquid crystal display is the most important display which has been recently used in a multimedia society and has been widely used from a portable phone to a computer monitor, a notebook, and a television. The liquid crystal display has a TN mode in which a liquid crystal layer with a twisted nematic liquid crystal is interposed between two orthogonal polarizers and then an electric field is applied in a direction vertical to a substrate. In the TN mode, at the time of displaying a black color, since the liquid crystal is aligned in the direction vertical to the substrate, at a tilted angle, birefringence due to liquid crystal molecules occurs and light leakage occurs.

In order to solve a viewing angle problem in the TN mode, an in-plane switching (IPS) mode is introduced, in which two electrodes are formed on one substrate and a director of the liquid crystal is adjusted with a lateral electric field generated between the two electrodes. That is, the IPS mode is called an in-plane switching liquid crystal display or a lateral electric field liquid crystal display, and electrodes are disposed on the same plane in a cell where the liquid crystal is disposed and then the liquid crystal is not aligned in a vertical direction, but aligned to be parallel to a lateral surface of the electrode.

However, in the case of the IPS mode, there is a problem in that it is difficult to embody high image quality by high reflectivity of a pixel electrode and a common electrode.

DETAILED DESCRIPTION OF THE INVENTION

Technical Problem

The present specification has been made in an effort to provide a conductive structure body, a method for manufacturing the same, and an electrode including the conductive structure body.

Technical Solution

An exemplary embodiment of the present specification provides a conductive structure body including: a substrate; a metal layer provided on the substrate; and a light reflection reducing layer provided on at least one surface of the metal layer, in which the light reflection reducing layer includes oxides of Mo and Ti or oxynitrides of Mo and Ti.

Another exemplary embodiment of the present specification provides a method for manufacturing the conductive structure body, the method including: preparing a substrate; forming a metal layer on the substrate; and forming a light reflection reducing layer on the metal layer, in which the light reflection reducing layer includes oxides of Mo and Ti or oxynitrides of Mo and Ti.

Still another exemplary embodiment of the present specification provides an electrode including the conductive structure body.

Yet another exemplary embodiment of the present specification provides an electronic device including the conductive structure body.

Advantageous Effects

An exemplary embodiment of the present specification provides a conductive structure body including: a substrate; a metal layer provided on the substrate; and a light reflection reducing layer provided on at least one surface of the metal layer, in which the light reflection reducing layer includes oxides of Mo and Ti or oxynitrides of Mo and Ti.

Another exemplary embodiment of the present specification provides a method for manufacturing the conductive structure body, the method including: preparing a substrate; forming a metal layer on the substrate; and forming a light reflection reducing layer on the metal layer, in which the light reflection reducing layer includes oxides of Mo and Ti or oxynitrides of Mo and Ti.

Still another exemplary embodiment of the present specification provides an electrode including the conductive structure body.

Yet another exemplary embodiment of the present specification provides an electronic device including the conductive structure body.

EXPLANATION OF REFERENCE NUMERALS AND SYMBOLS

100: Substrate
200: Metal layer
210: Metal pattern layer
300: Light reflection reducing layer
310: Light reflection reducing pattern layer

BEST MODE

In this specification, it will be understood that when a member is referred to as being "on" another member, it can be directly on the other member or intervening members may also be present.

Throughout the specification, unless explicitly described to the contrary, the word "comprise" and variations such as "comprises" or "comprising" will be understood to imply the inclusion of stated elements but not the exclusion of any other elements.

In this specification, a display device collectively refers to a TV, a computer monitor, or the like and includes a display element forming images and a case supporting the display element.

As the display element, a plasma display panel (PDP), a liquid crystal display (LCD), an electrophoretic display, a cathode-ray tube (CRT), an OLED display, and the like may be exemplified. In the display element, RGB pixel patterns and additional optical filters for implementing the image may be provided.

Meanwhile, with respect to the display device, as distribution of smart phones, tablet PCs, IPTVs, and the like is accelerated, a need for a touch function in which a human's hand become a direct input device without a separate input device such as a keyboard or a remote controller has gradually increased. Further, a multi-touch function capable of handwriting as well as specific point recognition has been required.

Currently, most of commercialized touch screen panels (TSPs) are based on transparent conductive ITO thin films, but at the time of applying the large-area touch screen panel, there are problems in that a touch recognition speed is decreased because of RC relay due to a relatively high surface resistance (a minimum of 150 Ω/square, ELECRYSTA product by Nitto Denko Corporation) of an ITO transparent electrode itself and an additional compensation chip for overcoming the problem needs to be introduced.

The present inventors studied a technology for replacing the transparent ITO thin film with a metal fine pattern. As a result, the present inventors found that in the case of using a metal thin film having high electric conductivity as an electrode use of the touch screen panel, when a fine electrode pattern having a specific shape is implemented, in terms of visibility due to high reflectivity, a problem in that the pattern is well viewed by the human eye and glaring due to high reflectivity, a haze value, and the like against external light may occur. Further, in a manufacturing process, the present inventors found that a target value is expensive or the process is complicated in many cases.

Further, in the case of using a metal fine line as a transparent electrode, the largest problem may be a reflective color. Due to a unique gloss of metal, a visibility problem such as a glare caused by an external light source may occur, and thus an additional layer capable of reducing reflection needs to be formed on the metal surface.

Further, since a metal fine line prepared with predetermined line width and pitch has a characteristic in which light is transmitted to most of the area while having low electric resistance, the metal fine line has been actively studied as a next-generation transparent electrode and touch sensor.

As a result, the present application provides a conductive structure body which may be differentiated from a touch screen panel using a conventional ITO-based transparent conductive thin film layer and applied to a touch screen panel with improved concealment of the metal fine pattern electrode and reflective and diffractive characteristics for external light.

Further, in the conventional display device, in order to prevent reflection of light, a light leakage phenomenon, and the like, a black matrix has been applied. As the black matrix, chromium oxide, a polymer resin, and the like may be used, and the chromium oxide tends to be decreased due to an environmental problem.

Recently, a color filter on TFT array (COT or COA) structure in which the color filter is formed on the array substrate together with a thin film transistor is introduced, and thus a structure without using the aforementioned black matrix has been developed. By introducing the structure without using the black matrix, effects such as transmittance improvement of the display device, brightness improvement, efficiency improvement of a backlight, and the like may be obtained. However, in the case of the structure without using the black matrix, the region where a metal electrode included in the display device may be exposed is increased, and thus there is a problem due to color and reflection characteristics of the metal electrode. Particularly, recently, since the display device has been enlarged and resolution is increased, a technology that may reduce reflection and color characteristics by the metal electrode included in the aforementioned display device has been required.

As a result, the present application provides a technology capable of reducing the reflectance of the metal electrode which may be included in the display device and neutrally mitigating a color characteristic in the structure of replacing the black matrix with other materials, structures, and the like or without using the black matrix.

Meanwhile, the present inventors found a problem having a very low etching property during etching for a patterning process when the light reflection reducing layer including oxides of Mo and Ti or oxynitrides of Mo and Ti was formed on the metal layer. Further, in the case of performing a batch etching process using one etchant for the light reflection reducing layer and the metal layer, an etching rate of the light reflection reducing layer including oxides of Mo and Ti or oxynitrides of Mo and Ti and an etching rate of the metal layer are excessively different and thus, the present inventors found a problem that patterning of the metal layer and the light reflection reducing layer was not performed well.

As a result, the present inventors created the conductive structure body including the light reflection reducing layer including oxides of Mo and Ti or oxynitrides of Mo and Ti having an excellent etching property and furthermore, the conductive structure body including the light reflection reducing layer including oxides of Mo and Ti or oxynitrides of Mo and Ti in which batch etching with the metal layer is possible.

Hereinafter, the present specification will be described in more detail.

An exemplary embodiment of the present specification provides a conductive structure body including: a substrate; a metal layer provided on the substrate; and a light reflection reducing layer provided on at least one surface of the metal layer, in which the light reflection reducing layer includes oxides of Mo and Ti or oxynitrides of Mo and Ti.

According to the exemplary embodiment of the present specification, the light reflection reducing layer is $MoTi_aO_xN_y$ ($0<a\leq2$, $0<x\leq3$, $0\leq y\leq2$, $x+y>0$, a, x and y mean ratios of the number of atoms of Ti, O and N, respectively).

According to the exemplary embodiment of the present specification, the element contents of O and N of the light reflection reducing layer satisfy Equation 1 below and the element content of O of the light reflection reducing layer is 20 at % or more and 60 at % or less.

$$0 \le \frac{N_{at\%}}{O_{at\%}} < 0.2 \qquad [\text{Equation 1}]$$

According to the exemplary embodiment of the present specification, the element content of N of the light reflection reducing layer may be 0 at % or more and 6 at % or less. Particularly, according to the exemplary embodiment of the present specification, the element content of N of the light reflection reducing layer may be 0 at % or more and 5 at % or less.

According to the exemplary embodiment of the present specification, the element content of O of the light reflection reducing layer may be 20 at % or more and 60 at % or less. Particularly, the element content of O of the light reflection reducing layer may be 25 at % or more and 60 at % or less. More particularly, the element content of O of the light reflection reducing layer may be 40 at % or more and 60 at % or less. Much more particularly, the element content of O of the light reflection reducing layer may be 40 at % or more and 55 at % or less.

According to the exemplary embodiment of the present specification, the element content of Mo of the light reflection reducing layer may be 25 at % or more and 40 at % or less.

According to the exemplary embodiment of the present specification, the element content of Ti of the light reflection reducing layer may be 10 at % or more and 25 at % or less. According to the exemplary embodiment of the present specification, the element content of Ti of the light reflection reducing layer may be 10 at % or more and 20 at % or less.

The present inventors found the fact that in the electronic device including the metal layer, visibility of the metal layer had an important effect on light reflection and diffraction characteristics by the metal layer and tend to improve the problem.

According to the exemplary embodiment of the present specification, in order to reduce reflectivity of the metal layer and improve an absorbance characteristic, the light reflection reducing layer may be introduced on at least one surface of the metal layer. The light reflection reducing layer is provided on at least one surface of the metal layer to largely improve a visibility deterioration problem according to high reflectivity of the metal layer.

According to the exemplary embodiment of the present specification, the light reflection reducing layer reduces amounts of light incident to the metal layer itself and light reflected from the metal layer due to absorption to lower reflectivity by the metal layer. Further, the light reflection reducing layer may have low reflectivity compared with the metal layer. As a result, the reflectivity of the light may be lowered as compared with a case where a user directly views the metal layer to largely improve the visibility of the conductive layer.

According to the exemplary embodiment of the present specification, the light reflection reducing layer means a layer that may reduce amounts of light incident to the metal layer itself and light reflected from the metal layer due to absorption, and the light reflection reducing layer may be expressed by terms of a darkening layer, a light absorbing layer, a light absorption layer, a blackening layer, a blackness layer, a reflection reducing layer, a low reflection layer, and the like.

According to the exemplary embodiment of the present specification, the light reflection reducing layer may be provided only on any one surface of an upper surface and a lower surface of the metal layer and provided on both surfaces.

According to the exemplary embodiment of the present specification, the light reflection reducing layer is provided between the metal layer and the substrate, and a total reflectance measured in an opposite direction to the surface with the light reflection reducing layer of the substrate may be 35% or less. Particularly, the total reflectance may be 20% or less, 15% or less, 10% or less, and 5% or less.

According to the exemplary embodiment of the present specification, the substrate, the metal layer, and the light reflection reducing layer are sequentially provided, and the total reflectance measured in an opposite direction to the surface with the metal layer of the light reflection reducing layer may be 35% or less. Particularly, the total reflectance may be 20% or less, 15% or less, 10% or less, and 5% or less.

According to the exemplary embodiment of the present specification, the light reflection reducing layers may be provided on the upper surface and the lower surface of the metal layer. That is, according to the exemplary embodiment of the present specification, the light reflection reducing layers may be provided on a surface adjacent to the substrate of the metal layer and an opposite surface to the surface adjacent to the substrate of the metal layer, respectively.

According to the exemplary embodiment of the present specification, the total reflectance means a reflectance of light at a wavelength of 300 to 800 nm, particularly 380 to 780 nm, and more particularly 550 nm which is incident at 90° to the surface to be measured after an opposite surface to the surface to be measured is treated with perfect black.

According to the exemplary embodiment of the present specification, the total reflectance is preferably a value measured based on a value at a wavelength of 550 nm of reflective light reflected by a target layer or a laminate to which the light is incident when the incident light is 100%, and the reason is that generally, the total reflectance at the wavelength of 550 nm is not largely different from the entire total reflectance. For example, a front light reflection reducing layer is formed on the substrate by using a material configuring the light reflection reducing layer and using a deposition method, for example, a method such as a sputtering method, a chemical vapor deposition (CVD) method, a thermal evaporation method, and then a reflectance (550 nm) of visible light incident from an air side may be measured. In this case, the entire blackening process is performed on a rear surface of the substrate, that is, a surface where the light reflection reducing layer is not formed to remove reflection on the rear surface of the substrate. The substrate may use a transparent substrate, and is not particularly limited, and for example, the substrate may use glass, a plastic substrate, a plastic film, and the like.

According to the exemplary embodiment of the present specification, the light reflection reducing layer may include a first surface contacting the metal layer and a second surface facing the first surface. When the total reflection of the conductive structure body is measured at the second surface side of the light reflection reducing layer, a total reflectance Rt of the conductive structure body may be calculated by Equation 1 below.

Total reflectance $Rt$=reflectance of substrate+closure rate×reflectance of light reflection reducing layer　　[Equation 1]

Further, the closure rate may be represented by an area ratio, that is, (1—aperture ratio) occupied by a region covered by the metal layer based on the plane of the substrate.

According to the exemplary embodiment of the present specification, a thickness of the light reflection reducing layer is not particularly limited as long as the light reflection reducing layer has the aforementioned total reflectance. However, in the case of considering an etching property with the metal layer in the manufacturing process, the thickness may be selected between 10 nm and 400 nm, but a preferable thickness may vary according to a used material and a manufacturing process, and the scope of the present application is not limited by the numerical range. More particularly, the thickness of the darkening layer may be 10 nm to 400 nm, 10 nm to 100 nm, 20 nm to 100 nm, 30 nm to 70 nm, and 30 nm to 60 nm, but is not limited thereto.

According to the exemplary embodiment of the present specification, when the thickness of the light reflection reducing layer is less than 10 nm, there is a problem in that high reflectivity by the first metal layer is not sufficiently decreased. Further, when the thickness of the light reflection reducing layer is more than 400 nm, there is a problem in that it is difficult to pattern the light reflection reducing layer.

According to the exemplary embodiment of the present specification, the light reflection reducing layer may be formed by a single layer or a multilayer of two or more layers. The light reflection reducing layer may have an achromatic color, but is not particularly limited thereto. In this case, the achromatic color means a color displayed when light incident to the surface of an object is not selectively absorbed, but evenly reflected and absorbed at a wavelength of each component.

Figure 2:
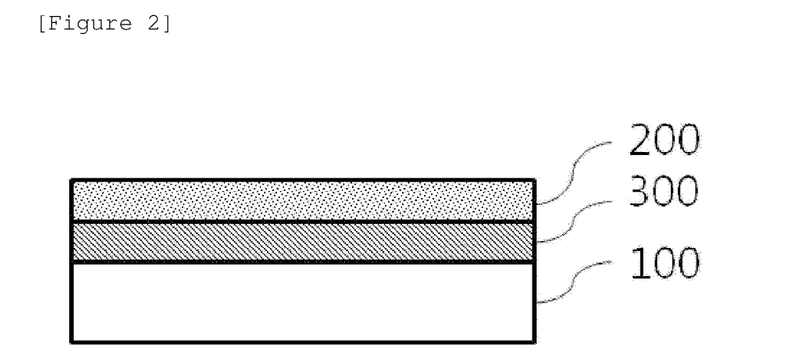

FIG. 2 illustrates a laminated structure of a conductive structure body according to an exemplary embodiment of the present specification. Particularly, FIG. 2 illustrates a conductive structure body in which a substrate 100, a light reflection reducing layer 300, and a metal layer 200 are sequentially provided. However, the conductive structure body is not limited to the structure of FIG. 2, but additioal layers may be further included.

Figure 1:
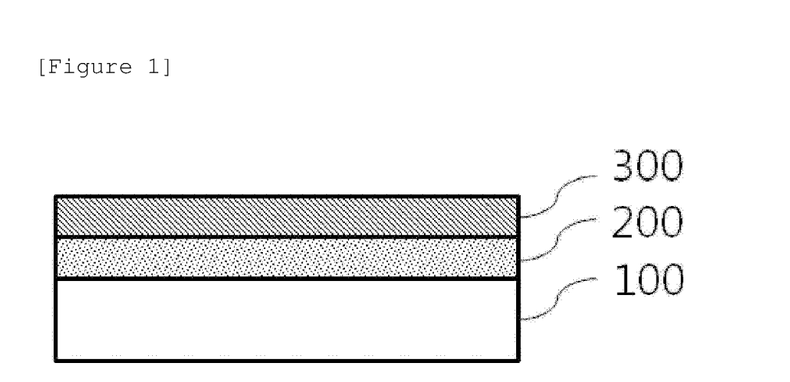
FIGS. 1 to 3 illustrate a laminated structure of a conductive structure body according to an exemplary embodiment of the present specification.

FIG. 1 illustrates a laminated structure of a conductive structure body according to an exemplary embodiment of the present specification. Particularly, FIG. 1 illustrates a conductive structure body in which a substrate 100, a metal layer 200, and a light reflection reducing layer 300 are sequentially provided. However, the conductive structure body is not limited to the structure of FIG. 1, but additional layers may be further included.

Figure 3:
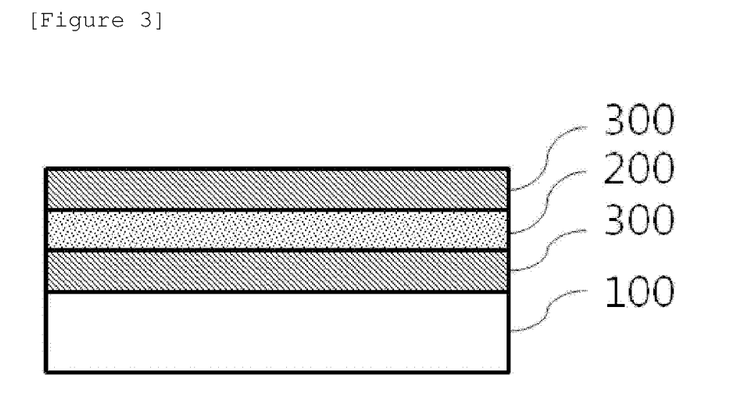

FIG. 3 illustrates a laminated structure of a conductive structure body according to an exemplary embodiment of the present specification. Particularly, FIG. 3 illustrates a conductive structure body in which a substrate 100, a light reflection reducing layer 300, a metal layer 200, and a light reflection reducing layer 300 are sequentially provided. However, the conductive structure body is not limited to the structure of FIG. 3, but additional layers may be further included.

According to the exemplary embodiment of the present specification, in the conductive structure body, a mean extinction coefficient k in a visible light area may be 0.1 to 1.5 and particularly 0.4 to 1.0. When the mean extinction coefficient k is 0.1 or more, there is an effect of enabling darkening. The mean extinction coefficient k is also called an absorption coefficient and is an element of determining transmittance of the conductive structure body, as a measure capable of defining how strong the conductive structure body absorbs light in a predetermined wavelength. For example, in the case of a transparent dielectric material, a k value is very small as k<0.1. However, as a metal component is increased in the material, the k value is increased. If the metal component is further increased, the material becomes a metal in which transmittance hardly occurs and only surface reflection mostly occurs, and the extinction coefficient k is more than 1.5 and thus, it is not preferred in the formation of the light reflection reducing layer.

According to the exemplary embodiment of the present specification, in the conductive structure body, a mean refractive index in the visible light area may be 2 to 3.

According to the exemplary embodiment of the present specification, the visible light area means an area having a wavelength of 360 to 820 nm.

According to the exemplary embodiment of the present specification, there may be few pinholes in the conductive structure body, and even though the pinhole is present, a diameter thereof may be 3 µm or less and more particularly 1 µm or less. When the diameter of the pinhole in the conductive structure body is 3 µm or less, the occurrence of disconnection may be prevented. Further, since there are few pinholes in the conductive structure body, the occurrence of disconnection may be prevented.

According to the exemplary embodiment of the present specification, each of the metal layer and the light reflection reducing layer may include a metal pattern layer including a plurality of apertures and a light reflection reducing pattern layer.

According to the exemplary embodiment of the present specification, the metal pattern layer may be formed through patterning of the metal layer.

According to the exemplary embodiment of the present specification, the light reflection reducing pattern layer may be formed through patterning of the light reflection reducing layer.

According to the exemplary embodiment of the present specification, the metal pattern layer may include a plurality of apertures and metal lines partitioning the apertures.

According to the exemplary embodiment of the present specification, the light reflection reducing pattern layer may include a plurality of apertures and light reflection reducing lines partitioning the apertures.

According to the exemplary embodiment of the present specification, the light reflection reducing lines may be provided on at least one surface of the metal lines.

According to the exemplary embodiment of the present specification, the light reflection reducing pattern layer may be provided on at least one surface of the metal pattern layer. Particularly, the light reflection reducing pattern layer may have the same shaped pattern as the metal pattern layer. However, each of the metal pattern layer and the light reflection reducing pattern layer need not be completely the same as the line width of the adjacent pattern layer, and a case where the line width is smaller or larger than the line width of the adjacent pattern layer is also included in the scope of the present specification.

According to the exemplary embodiment of the present specification, the line width of the light reflection reducing pattern layer may be 80% or more and 120% or less of the line width of the metal pattern layer. More particularly, the line width of the light reflection reducing pattern layer may be equal to or larger than the line width of the metal pattern layer.

According to the exemplary embodiment of the present specification, when the light reflection reducing pattern layer has a line width larger than the line width of the metal layer, when viewed from the user, the light reflection reducing pattern layer may largely give an effect of covering the metal pattern layer, and thus, there is an advantage in that an effect of luster or reflection of the metal layer itself may be efficiently blocked. However, even though the line width of the light reflection reducing pattern layer is the same as the line width of the metal pattern layer, an effect of the light reflection reduction may be achieved.

According to the exemplary embodiment of the present specification, the metal pattern layer and the light reflection reducing pattern layer may form a regular pattern or an irregular pattern. Particularly, the metal pattern layer and the light reflection reducing pattern layer may be provided by forming patterns on the substrate through the patterning process.

According to the exemplary embodiment of the present specification, the pattern may have a polygon such as a triangle and a quadrangle, a circle, an ellipse, or an amorphous shape. The triangle may be a regular triangle, a right-angled triangle, or the like and the quadrangle may be a square, a rectangle, a trapezoid, or the like.

According to the exemplary embodiment of the present specification, as the regular pattern, pattern forms in the art such as a mesh pattern may be used. The irregular pattern is not particularly limited, but may be a boundary line form of figures configuring a Voronoi diagram. According to the exemplary embodiment of the present specification, in the case of using the irregular pattern as the pattern form, a diffractive pattern of reflective light by directional lighting may be removed by the irregular pattern and an effect by scattering of light may be minimized by the light reflection reducing pattern layer, and as a result, the problem in the visibility may be minimized.

According to the exemplary embodiment of the present specification, line widths of the metal pattern layer and the light reflection pattern layer may be 0.1 µm or more and 100 µm or less, respectively.

According to the exemplary embodiment of the present specification, particularly, the line widths of the metal pattern layer and the light reflection pattern layer may be 0.1 µm or more and 50 µm or less, 0.1 µm or more and 30 µm or less, or 0.1 µm or more and 10 µm or less, but are not limited thereto. The line widths of the metal pattern layer and the light reflection pattern layer may be designed according to a final use of the conductive structure body.

According to the exemplary embodiment of the present specification, when the line widths of the metal pattern layer and the light reflection pattern layer are less than 0.1 µm, it is difficult to embody the patterns, and when the line widths are more than 100 µm, visibility may be deteriorated.

According to the exemplary embodiment of the present specification, a line gap between adjacent pattern lines of the metal pattern layer and the light reflection pattern layer may be 0.1 µm or more and 100 µm or less.

According to the exemplary embodiment of the present specification, the line gap may be 0.1 µm or more, more particularly 10 µm or more, and much more particularly 20 µm or more. Further, according to the exemplary embodiment of the present specification, the line gap may be 100 µm or less and more particularly 30 µm or less.

According to the exemplary embodiment of the present specification, the metal pattern layer and the light reflection reducing pattern layer may be embodied by the patterns of the fine line widths, and thus, an electrode including the metal pattern layer and the light reflection reducing pattern layer may embody excellent visibility.

Figure 4:
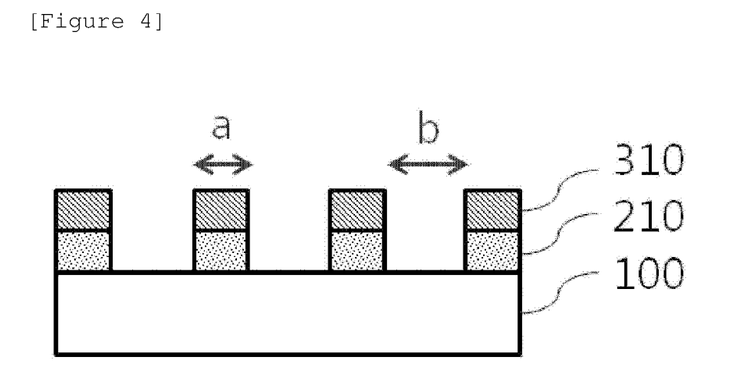
FIG. 4 illustrates a laminated structure when the conductive structure body according to the exemplary embodiment of the present specification is patterned.

FIG. 4 illustrates a laminated structure when the conductive structure body according to the exemplary embodiment of the present specification is patterned. Particularly, FIG. 4 illustrates that a substrate 100, the metal pattern layer 210, a light reflection reducing pattern layer 310 are sequentially provided. However, the conductive structure body is not limited to the structure of FIG. 4, but additional layers may be further included. In FIG. 4, a means line widths of the metal pattern layer and the light reflection reducing pattern layer and b means a line gap between adjacent pattern lines of the metal pattern layer and the light reflection reducing pattern layer.

According to the exemplary embodiment of the present specification, the conductive structure body means not only a structure in which a metal layer and a darkening layer are laminated as separate layers, but also a multilayered structure in which the metal layer and the darkening layer are sequentially deposited through a deposition process such as sputtering and the like. That is, the conductive structure body according to the exemplary embodiment of the present application may be expressed by terms of a conductive laminate, a conductive multilayered structure, and the like.

According to the exemplary embodiment of the present specification, the material of the metal layer is not particularly limited, but a material having excellent conductivity and easy etching is preferable. However, generally, a material having excellent conductivity has a disadvantage of a high reflectance. However, in the exemplary embodiment of the present specification, the darkening layer is used to form the metal layer by using a material having a high reflectance. In the exemplary embodiment of the present application, even in the case of using a material having a total reflectance of 70% to 80% o more, it is possible to reduce a reflectance through the light reflection reducing layer, reduce visibility of the metal layer, and maintain or improve a contrast characteristic.

According to the exemplary embodiment of the present specification, the metal layer may include one or more metals of Cu, Ag, Ar, Cr, Co, Al, Mo, Ti, Fe, V, Ni, and alloys thereof. Particularly, according to the exemplary embodiment of the present specification, the metal layer may include Cu or MoTi as a main component. Further, according to the exemplary embodiment of the present specification, the metal layer may be made of Cu or MoTi.

According to the exemplary embodiment of the present specification, when the metal layer may include Cu or MoTi as a main component, a batch etching with the light reflection reducing layer may be more easily performed.

According to the exemplary embodiment of the present specification, a thickness of the metal layer may be 10 nm or more and 10 µm or less. Particularly, the thickness of the metal layer may be 10 nm or more and 1 µm or less. More particularly, the thickness of the metal layer may be 100 nm or more and much more particularly, the thickness of the metal layer may be 150 nm or more. Further, according to the exemplary embodiment of the present specification, the thickness of the metal layer may be 500 nm or less and more particularly 200 nm or less. Since the electric conductivity depends on a thickness, if the metal layer is very thin, a continuous thickness is not formed and thus there is a problem in that a specific resistance value is increased, and as a result, the thickness of the metal layer may be 100 nm or more.

According to the exemplary embodiment of the present specification, the substrate may be a transparent substrate. Particularly, according to the exemplary embodiment of the present specification, the substrate may be glass, polyethylene terephthalate (PET), polycarbonate (PC) or polyamide (PA). Further, according to the exemplary embodiment of the present specification, the substrate may be an insulating layer of a liquid crystal display element. Particularly, the substrate may be any member provided with the metal layer.

According to the exemplary embodiment of the present specification, a transparent conductive layer may be further provided between the substrate and the metal layer.

According to an exemplary embodiment of the present specification, the transparent conductive layer may use a transparent conductive oxide layer. The transparent conductive oxide may use indium oxide, zinc oxide, indium tin oxide, indium zinc oxide, indium zinc tin oxide, an amorphous transparent conductive polymer, etc. and use one kind or two kinds or more thereof, but is not limited thereto. According to the exemplary embodiment of the present specification, the transparent conductive layer may be an indium tin oxide layer.

According to the exemplary embodiment of the present specification, a thickness of the transparent conductive layer may be 15 nm or more and 20 nm or less, but is not limited thereto. The transparent conductive layer may be formed by using the aforementioned material for the transparent conductive layer through a deposition process or a printing process.

According to the exemplary embodiment of the present specification, the surface resistance of the conductive structure body may be 1 Ω/square or more and 300 Ω/square or less, particularly 1 Ω/square or more and 100 Ω/square or less, more particularly 1 Ω/square or more and 50 Ω/square or less, and much more particularly 1 Ω/square or more and 20 Ω/square or less.

According to the exemplary embodiment of the present specification, if the surface resistance of the conductive structure body is 1 Ω/square or more and 300 Ω/square or less, there is an effect of replacing an ITO transparent electrode in the related art. When the surface resistance of the conductive structure body is 1 Ω/square or more and 100 Ω/square or less or 1 Ω/square or more and 50 Ω/square or less, particularly, 1 Ω/square or more and 20 Ω/square or less, the surface resistance is significantly low as compared with when the ITO transparent electrode in the related art is used. Thus, there are advantages in that when a signal is applied, the RC delay becomes shorter, and as a result, the touch recognition speed may be significantly improved and as a result, a touch screen having a large area of 10 inches or more is easily applied.

According to the exemplary embodiment of the present specification, the surface resistance of the metal layer or the darkening layer before patterning in the conductive structure body may be more than 0 Ω/square and 2 Ω/square or less and particularly, more than 0 Ω/square and 0.7 Ω/square or less. When the surface resistance is 2 Ω/square or less, particularly, 0.7 Ω/square or less, as the surface resistance of the metal layer or the darkening layer before patterning is lowered, a fine patterning design and a manufacturing process are easily performed, and the surface resistance of the conductive structure body after patterning is lowered and thus, there is an effect of increasing a reaction rate of the electrode. The surface resistance may be adjusted depending on a thickness of the metal layer or the darkening layer.

According to the exemplary embodiment of the present specification, in the conductive structure body other than the use of the touch screen, the range of the surface resistance is not largely limited, and may be 10 kΩ/square or less.

An exemplary embodiment of the present specification provides a method for manufacturing the conductive structure body.

According to the exemplary embodiment of the present specification, the method for manufacturing the conductive structure body includes: preparing a substrate; forming a metal layer on the substrate; and forming a light reflection reducing layer on the metal layer, in which the light reflection reducing layer includes oxides of Mo and Ti or oxynitrides of Mo and Ti.

According to the exemplary embodiment of the present specification, the method for manufacturing the conductive structure body includes forming the light reflection reducing layer including MoTi$_a$O$_x$N$_y$ (0<a≤2, 0<x≤3, 0≤y≤2, x+y>0, a, x and y mean ratios of the number of atoms of Ti, O and N, respectively) on the metal layer.

According to the exemplary embodiment of the present specification, the method for manufacturing the conductive structure body includes forming the light reflection reducing layer on the metal layer, in which element contents of O and N satisfy Equation 1 below and the element content of O is 20 at % or more and 60 at % or less.

$$0 \leq \frac{N_{at\%}}{O_{at\%}} < 0.2 \quad \text{[Equation 1]}$$

In the method for manufacturing the conductive structure body according to the exemplary embodiment of the present specification, a configuration of the substrate, the metal layer, the light reflection reducing layer, the metal pattern layer, the light reflection reducing pattern layer, etc. is the same as described above.

According to the exemplary embodiment of the present specification, after the forming of the metal layer, the forming of the light reflection reducing layer may be performed. Alternatively, according to the exemplary embodiment of the present specification, after the forming of the light reflection reducing layer, the forming of the metal layer may be performed.

According to the exemplary embodiment of the present specification, in the forming of the metal layer, the metal layer may be formed on one surface of the substrate as an entire layer.

According to the exemplary embodiment of the present specification, in the forming of the light reflection reducing layer, the light reflection reducing layer may be formed on one surface of the metal layer as an entire layer. The entire layer may mean one physically continuous side or film which is formed on an area of 80% or more of one surface of a lower member formed with a target member. Particularly, the entire layer may mean one layer before being patterned.

According to the exemplary embodiment of the present specification, the forming of the metal layer and the forming of the light reflection reducing layer may use methods such as evaporation, sputtering, wet coating, vaporization, electroplating or electroless plating, lamination of a metal film, and the like, respectively. Particularly, according to the exemplary embodiment of the present specification, the forming of the metal layer and the forming of the light reflection reducing layer may use a deposition or sputtering method, respectively.

According to the exemplary embodiment of the present specification, the metal layer may be formed by using a printing method. Particularly, the printing method may use ink or paste including a metal, and the paste may further include a binder resin, a solvent, a glass frit, and the like in addition to the metal.

According to the exemplary embodiment of the present specification, the forming of the light reflection reducing layer may use a sputtering method in which oxygen gas partial pressure and nitrogen gas partial pressure satisfy Equation 2 below.

$$0 \le \frac{N_{2sccm}}{O_{2sccm}} < 10 \quad \text{[Equation 2]}$$

A standard cubic centimeter per minutes (sccm) of the present specification may be cm³/min.

According to the exemplary embodiment of the present specification, the sputtering method may be a DC sputtering method.

According to the exemplary embodiment of the present specification, the oxygen gas partial pressure may be 3 sccm or more and 10 sccm or less.

According to the exemplary embodiment of the present specification, the nitrogen gas partial pressure may be 0 sccm or more and 20 sccm or less.

According to the exemplary embodiment of the present specification, in the case of using the sputtering method, a flexible characteristic of the light reflection reducing layer is excellent. In a thermal evaporation method and an e-beam evaporation method, particles are simply stacked, but in the sputtering method, even though particles form a nucleus by collision and the nucleus grows and warps, a mechanical property is excellent. Further, in the case of using the sputtering method, adhesion of an interface between the light reflection reducing layer and another layer is excellent. As such, by using the sputtering method, the light reflection reducing layer may be directly formed on the substrate or the conductive layer without using an adhesive layer or a bonding layer and may embody desired thickness and pattern shape.

According to the exemplary embodiment of the present specification, the light reflection reducing layer is directly provided on substrate or the metal layer without interposing a bonding layer or an adhesive layer. The bonding layer or the adhesive layer may have an effect on durability or an optical property. Further, the manufacturing method for the conductive structure body according to the exemplary embodiment of the present application is completely different from the case of using the bonding layer or the adhesive layer. Further, as compared with the case of using the bonding layer or the adhesive layer, in the present application, an interface characteristic between the substrate or the metal layer and the light reflection reducing layer is excellent.

According to the exemplary embodiment of the present specification, the method for forming the metal layer is not particularly limited. The metal layer may be formed by direct printing, and after the metal layer is formed, the metal layer is patterned to be prepared as a metal pattern.

According to the exemplary embodiment of the present specification, when the metal layer is formed by a printing method, ink or paste of the metal material may be used, and the paste may further include a binder resin, a solvent, or a glass frit in addition to the metal material.

According to the exemplary embodiment of the present specification, the metal layer may be formed by methods such as evaporation, sputtering, wet coating, vaporization, electroplating or electroless plating, lamination of a metal film, and the like. Further, the method for forming the metal layer may use a method of coating organic metal, nano metal or a complex solution thereof on the substrate and then giving conductivity by firing and/or drying. As the organic metal, organic sliver may be used, and as the nano metal, nano silver particles and the like may be used.

According to the exemplary embodiment of the present specification, forming a metal pattern layer and a light reflection reducing pattern layer by batch-etching the metal layer and the light reflection reducing layer may be further included.

According to the exemplary embodiment of the present specification, the batch etching means patterning simultaneously the metal layer and the light reflection reducing layer by one etching process by using one etchant.

According to the exemplary embodiment of the present specification, the etchant is an etchant commonly used in the art and any etchant capable of etching the light reflection reducing layer may be applied.

According to the exemplary embodiment of the present specification, the patterning may use a material having an etching resist characteristic. The etching resist may form a resist pattern by using a printing method, a photolithography method, a photography method, a dry film resist method, a wet resist method, a method using a mask or laser transfer, for example, thermal transfer imaging, and the like, and particularly, a dry film resist method may be used. However, the etching resist is not limited thereto. The metal layer and/or the light reflection reducing layer are etched and patterned by using the etching resist pattern and the etching resist pattern may be easily removed by a strip process.

According to the exemplary embodiment of the present specification, the forming of the metal pattern layer and the light reflection reducing pattern layer may include adjusting an exposure time for the etchant of the metal layer and the light reflection reducing layer to 1 minute or more and 4 minutes or less or 1 minute or more and 3 minutes or less.

When the exposure time for the etchant, that is, the etching time is in the range, the metal layer and the light reflection reducing layer may be fine-patterned.

An exemplary embodiment of the present specification provides an electrode including the conductive structure body.

According to the exemplary embodiment of the present specification, the electrode may be an electrode for a touch panel, an electrode for a liquid crystal display, or an electrode for an OLED display.

An exemplary embodiment of the present specification provides an electronic device including the conductive structure body.

According to the exemplary embodiment of the present specification, the electronic device may include a touch screen panel, a display device, a solar cell, and the like, but is not limited thereto.

More particularly, for example, in a capacitive touch screen panel, the conductive structure body according to the exemplary embodiment of the present invention may be used as a touch sensitive electrode substrate.

The touch screen panel may further include an additional structure body other than the conductive structure body including the substrate, the metal layer, and the light reflection reducing layer described above. In this case, the two structure bodies may be disposed in the same direction, or may be disposed in directions opposite to each other. Two or more structure bodies that may be included in the touch screen panel of the present invention need not to have the same structure, and any one, preferably, only the structure body closest to the user may include the substrate, the metal layer, and the light reflection reducing layer, and the additional structure body may not include the patterned light reflection reducing layer. Further, layer-laminated structures in the two or more structure bodies may be different from each other. When two or more structure bodies are included, an insulating layer may be provided therebetween. In this case, the insulating layer may additionally have a function as an adhesive layer.

According to the exemplary embodiment of the present specification, the touch screen panel may include a lower substrate; an upper substrate; and an electrode layer provided on any one surface or both surfaces of a surface of the lower substrate contacting the upper substrate and a surface of the upper substrate contacting the lower substrate. The electrode layers may perform a function for detecting an X-axial position and a Y-axial position, respectively.

In this case, one or two of the electrode layer provided on the lower substrate and the surface of the lower substrate contacting the upper substrate; and the electrode layer provided on the upper substrate and the surface of the upper substrate contacting the lower substrate may be the conductive structure body according to the aforementioned exemplary embodiment of the present application. In the case where only one of the electrode layers is the conductive structure body according to the present application, the other electrode layer may have a metal pattern which is known in the art.

In the case where the electrode layers are provided on one surfaces of both the upper substrate and the lower substrate to form an electrode layer of two layers, an insulating layer or a spacer may be provided between the lower substrate and the upper substrate so that a distance between the electrode layers is uniformly maintained and the electrode layers are not connected to each other. The insulating layer may include an adhesive agent or a UV or thermosetting resin.

The touch screen panel may further include a ground portion connected to the metal pattern in the aforementioned conductive structure body. For example, the ground portion may be formed at an edge of the surface with the metal pattern of the substrate. Further, at least one of an antireflective film, a polarization film, and an anti-fingerprinting film may be provided on at least one surface of a laminate including the conductive structure body. According to a design specification, different kinds of functional films may further be included in addition to the aforementioned functional films. As described above, the touch screen panel may be applied to display devices such as an OLED display panel (PDP), a liquid crystal display (LCD), a cathode-ray tube (CRT), and a PDP. According to the exemplary embodiment of the present specification, the touch screen panel may further include an electrode portion or a pad portion on the conductive structure body and in this case, an effective screen portion, the electrode portion, and the pad portion may be configured by the same conductive body.

According to the exemplary embodiment of the present specification, in the touch screen panel, the light reflection reducing layer may be provided at a side viewed by the user.

Further, the solar cell may include an anode electrode, a cathode electrode, a photoactive layer, a hole transporting layer and/or an electron transporting layer, and the conductive structure body according to the exemplary embodiment of the present application may be used as the anode electrode and/or the cathode electrode.

The conductive structure body may replace conventional ITO in the display device or the solar cell and may be used as a flexible application. Further, the conductive structure body may be used as a next-generation transparent electrode together with CNT, a conductive polymer, graphene, or the like. In the exemplary embodiment of the present application, the conductive structure body may serve as a thin film transistor array substrate, a color filter substrate, and the like.

According to the exemplary embodiment of the present specification, the display device may be a color filter on TFT array (COT or COA) in which a color filter is formed on an array substrate in addition to a thin film transistor.

According to the exemplary embodiment of the present specification, the display device includes one or more kinds of electrodes of a gate electrode, a source electrode, a drain electrode, a common electrode and a pixel electrode and one or more kinds of electrodes may include the conductive structure body according to the present application. In this case, the display device may include a structure and materials which are known in the art, except for including the aforementioned conductive structure body. Further, in the exemplary embodiment of the present application, when the source electrode and the drain electrode include the conductive structure body according to the present application, the source electrode and the drain electrode may be formed by using the same etchant, and thus, it is advantageous that it is easy to form the pattern.

According to the exemplary embodiment of the present specification, the display device may be a liquid crystal display or an organic light emitting device. The organic light emitting device may be a bottom emission type organic light emitting device and a top emission type organic light emitting device. In this case, in the case of the bottom emission type or top emission type organic light emitting device, the gate electrode, the source electrode, the drain electrode, the common electrode, and the pixel electrode described above may include at least the conductive structure body having a structure in which the light reflection reducing layer is provided at the side viewed from the user.

According to the exemplary embodiment of the present application, even in the case of the liquid crystal display, the gate electrode, the source electrode, the drain electrode, the common electrode, and the pixel electrode described above may include the conductive structure body having a structure in which the darkening layer is provided at the side viewed from the user. In this case, when the conductive structure body is a structure in which the darkening layers are provided on both surfaces of the conductive layer, light reflection due to a lower back light unit may be additionally suppressed.

Hereinafter, the present specification will be described in detail with reference to Examples for a specific description. However, the Examples according to the present specification may be modified in various forms, and it is not interpreted that the scope of the present invention is limited to the Examples described in detail below. The Examples of the present invention will be provided for more completely explaining the present invention to those skilled in the art.

EXAMPLES 1 TO 3 AND COMPARATIVE EXAMPLES 1 AND 2

A glass substrate was loaded in a sputtering chamber and then vacuum of about $3 \times 10^{-6}$ Torr was maintained. In addition, a metal layer with a thickness of about 100 nm was formed on a Cu sputtering target by using DC power.

By a DC sputtering method of 200 W and 6 mTorr by injecting argon gas on the metal layer at 45 sccm and adjusting partial pressure of oxygen gas and nitrogen gas, as illustrated in Table 1 below, the light reflection reducing layer was formed to manufacture a conductive structure body.

Furthermore, whether to pattern the metal layer and the light reflection reducing layer through batch etching was performed by using a hydrogen peroxide-based etchant.

Further, the element contents of the light reflection reducing layer of the conductive structure body manufactured above were measured and illustrated in Table 2 below.

TABLE 1

| | Partial pressure of argon gas (sccm) | Partial pressure of oxygen gas (sccm) | Partial pressure of nitrogen gas (sccm) | Mean total reflectance (%) | Etching time (sec) |
|---|---|---|---|---|---|
| Comparative Example 1 | 45 | 0 | 20 | 18.9 | >240 |
| Comparative Example 2 | 45 | 1 | 20 | 12.7 | 210 |
| Example 1 | 45 | 3 | 20 | 9.4 | 135 |
| Example 2 | 45 | 6 | 20 | 17.6 | 59 |
| Example 3 | 45 | 3 | 0 | 31.3 | 120 |

TABLE 2

| | Mo (at %) | Ti (at %) | O (at %) | N (at %) | O (at %)/N (at %) | N (at %)/O (at %) | Etchability |
|---|---|---|---|---|---|---|---|
| Comparative Example 1 | 34.2 | 15.3 | 17.7 | 26.0 | 0.7 | 1.47 | x |
| Comparative Example 2 | 34.5 | 14.8 | 37.4 | 7.5 | 5.0 | 0.2 | Δ |
| Example 1 | 33.2 | 14.5 | 42.5 | 4.6 | 9.2 | 0.11 | ○ |
| Example 2 | 28.6 | 12.7 | 53.9 | 1.3 | 41.5 | 0.02 | ○ |
| Example 3 | 37.8 | 19.5 | 38.5 | 0 | — | 0 | ○ |

According to Tables 1 and 2, in the conductive structure body manufactured according to the Comparative Examples, it can be seen that there is a problem in that batch etching is not easily formed or the light reflection reducing layer is not etched. On the contrary, it can be seen that the light reflection reducing layer manufactured according to the Examples may be batch-etched and the metal layer and the light reflection reducing layer may be patterned.

EXAMPLE 4

An electrode structure body in Example 4 was manufactured by forming a Cu layer having a thickness of 60 nm as a conductive layer on a glass substrate by a DC sputtering method using a Cu single target and forming a light reflection reducing layer including $MoTi_aN_xO_y$ ($0<a\leq2$, $0<x\leq3$, $0<y\leq2$) with a thickness of 35 nm by a reactive DC sputtering method using a MoTi (50:50 at %) alloy target.

EXAMPLE 5

An electrode structure body in Example 5 was manufactured by forming a Cu layer having a thickness of 60 nm as a first conductive layer on a glass substrate by a DC sputtering method using a CU single target, forming a MoTi layer having a thickness of 20 nm by a DC sputtering method using a MoTi (50:50 at %) alloy target as a second conductive layer, and forming a light reflection reducing layer including $MoTi_aN_xO_y$ ($0<a\leq2$, $0<x\leq3$, $0<y\leq2$) with a thickness of 35 nm by a reactive DC sputtering method using the same target.

COMPARATIVE EXAMPLE 3

An electrode structure body in Comparative Example 3 was manufactured by forming a Cu layer having a thickness of 60 nm as a first conductive layer on a glass substrate by a DC sputtering method using a CU single target and forming a MoTi layer having a thickness of 10 to 60 nm as a second conductive layer by a DC sputtering method using a MoTi (50:50 at %) alloy target.

EXPERIMENTAL EXAMPLE 1

Figure 5:
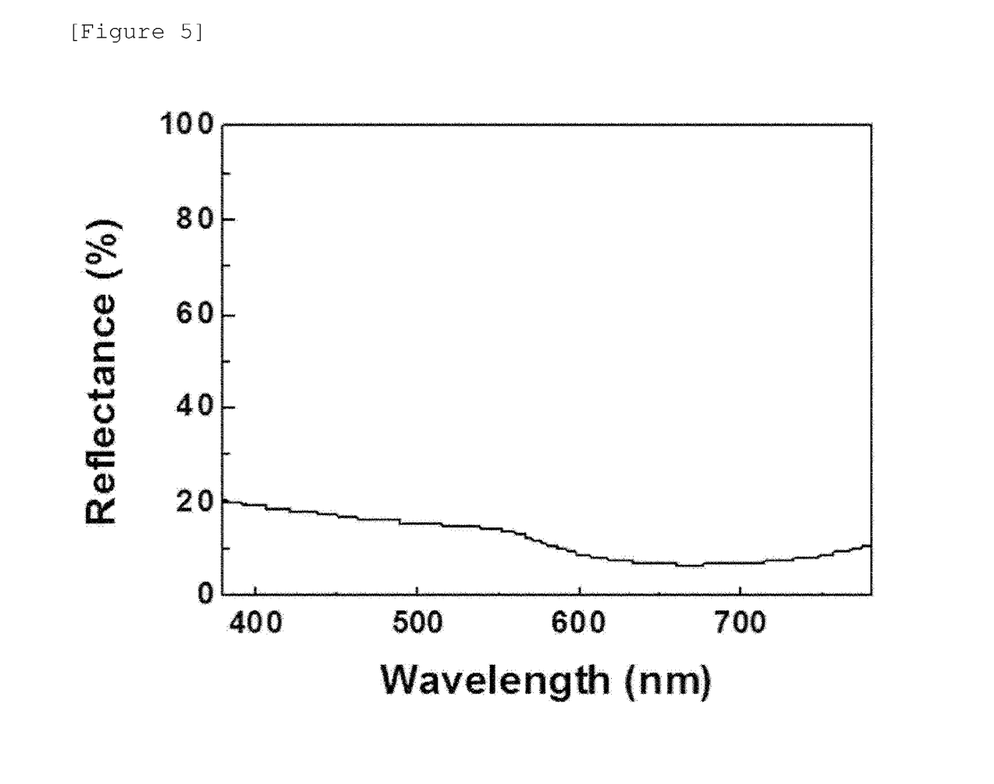
FIG. 5 is a diagram illustrating a total reflectance of a conductive structure body in Example 4, as an exemplary embodiment of the present specification.
Figure 6:
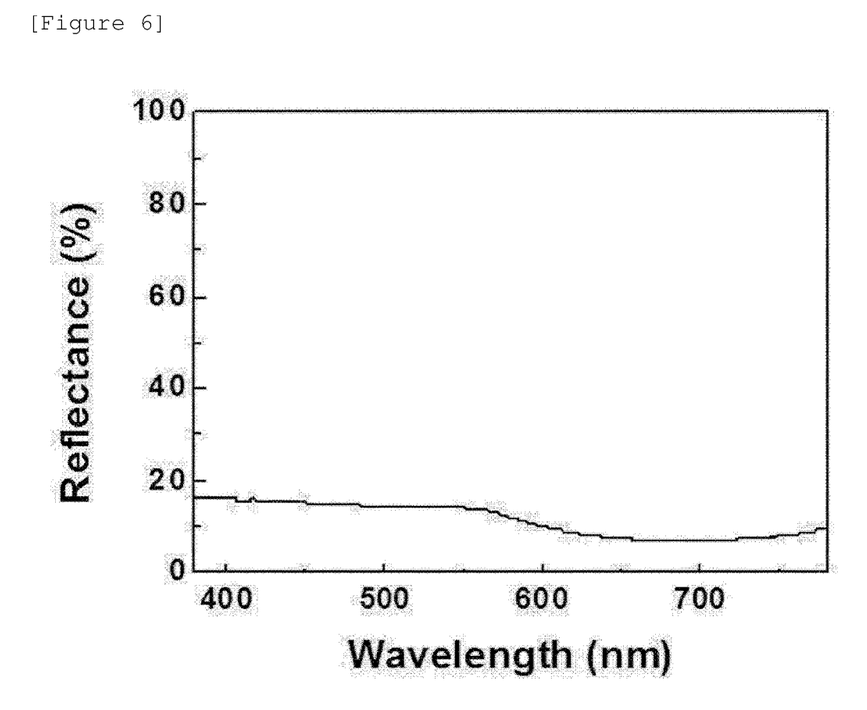
FIG. 6 is a diagram illustrating a total reflectance of a conductive structure body in Example 5, as an exemplary embodiment of the present specification.
Figure 7:
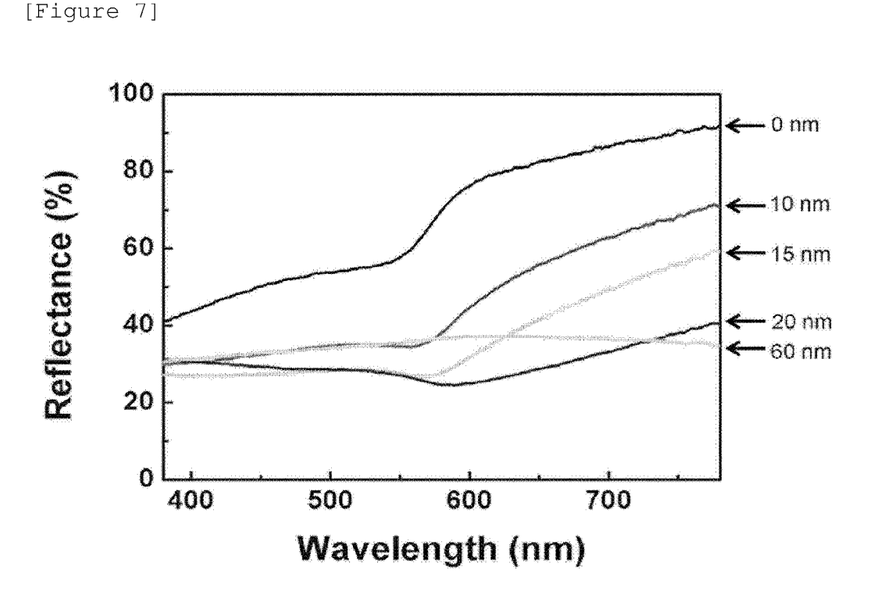
FIG. 7 is a diagram illustrating a total reflectance of a conductive structure body in Comparative Example 3, as an exemplary embodiment of the present specification.

Total reflectance according to a wavelength of the conductive structure bodies in Examples 4 and 5 and Comparative Example 3 was simulated by using a Solidspec 3700 (UV-Vis spectrophotometer, by Shimadzu Co., Ltd.) and the results were illustrated in FIGS. 5 to 7 below.

The invention claimed is:
1. A conductive structure body, comprising:
    a substrate;
    a metal layer provided on the substrate; and
    a light reflection reducing layer provided on at least one surface of the metal layer,
    wherein the light reflection reducing layer consists of $MoTi_aO_xN_y$ ($0<a\leq2$, $0<x\leq3$, $0<y\leq2$, x+y>0, and a, x and y mean ratios of the number of atoms of Ti, O and N, respectively), and
    wherein the light reflection reducing layer has an element content of O and N that satisfy $0<N_{at\ \%}/O_{at\ \%}\leq0.02$,
    wherein the element content of O of the light reflection reducing layer is 42.5 at % or more and less than 53.9 at %,
    wherein the element content of Mo of the light reflection reducing layer is 28.6 at % or more and 33.2 at %,
    wherein the element content of Ti of the light reflection reducing layer is 12.7 at % or more and 14.5 at % or less, and
    wherein the element content of N of the light reflection reducing layer is 1.3 at % or more and 4.6 at % or less.
2. The conductive structure body of claim 1, wherein the light reflection reducing layer is provided between the metal layer and the substrate, and total reflectance measured in an opposite direction to a surface with the light reflection reducing layer of the substrate is 35% or less.
3. The conductive structure body of claim 1, wherein the substrate, the metal layer, and the light reflection reducing layer are sequentially provided and total reflectance measured in an opposite direction to a surface with the metal layer of the light reflection reducing layer is 35% or less.
4. The conductive structure body of claim 1, wherein the light reflection reducing layers are provided on an upper surface and a lower surface of the metal layer.

5. The conductive structure body of claim 1, wherein a thickness of the light reflection reducing layer is 10 nm or more and 400 nm or less.

6. The conductive structure body of claim 1, wherein a mean extinction coefficient k in a visible light area of the conductive structure body is 0.1 to 15.

7. The conductive structure body of claim 1, wherein a mean refractive index in a visible light area of the conductive structure body is 2 to 3.

8. The conductive structure body of claim 1, wherein the metal layer and the light reflection reducing layer include a metal pattern layer and a light reflection reducing pattern layer including a plurality of apertures, respectively.

9. The conductive structure body of claim 8, wherein line widths of the metal pattern layer and the light reflection reducing pattern layer are 0.1 µm or more and 100 µm or less.

10. The conductive structure body of claim 8, wherein a line gap between adjacent pattern lines of the metal pattern layer and the light reflection reducing pattern layer is 0.1 µm or more and 100 µm or less.

11. The conductive structure body of claim 8, wherein the line width of the light reflection reducing pattern layer is 80% or more and 120% or less of the line width of the metal pattern layer.

12. A method for manufacturing the conductive structure body of claim 1, the method comprising:
preparing a substrate;
forming a metal layer on the substrate, and
forming a light reflection reducing layer on the metal layer,
wherein the light reflection reducing layer consists of $MoTi_aO_xN_y$ (0<a≤2, 0<x≤3, 0<y≤2, x+y>0, and a, x and y mean ratios of the number of atoms of Ti, O and N, respectively), and
wherein the light reflection reducing layer has an element content of O and N that satisfy $0<N_{at\ \%}/O_{at\ \%} \leq 0.02$,
wherein the element content of O of the light reflection reducing layer is 42,5 at % or more and less than 53.9 at %,
wherein the element content of Mo of the light reflection reducing layer is 28.6 at % or more and 33.2 at %,
wherein the element content of Ti of the light reflection reducing layer is 12.7 at % or more and 14.5 at % or less, and
wherein the element content of N of the light reflection reducing layer is 1.3 at % or more and 4.6 at % or less.

13. The method of claim 12, wherein the forming of the light reflection reducing layer uses a sputtering method in which partial pressure of oxygen gas and partial pressure of nitrogen gas satisfy Equation 2 below.

$$0 \leq \frac{N_{2sccm}}{O_{2sccm}} < 10 \qquad \text{[Equation 2]}$$

14. An electrode including the conductive structure body of claim 1.

15. An electronic device including the conductive structure body of any claim 1.

* * * * *